(12) United States Patent
Iwanusiw et al.

(10) Patent No.: US 11,105,838 B2
(45) Date of Patent: Aug. 31, 2021

(54) SYSTEM AND METHOD FOR MEASURING TURNS RATIO OF A TRANSFORMER

(71) Applicant: AVO Multi-Amp Corporation, Dallas, TX (US)

(72) Inventors: Oleh Iwanusiw, Toronto (CA); Vince Oppedisano, Richmond Hill (CA); Kristopher Neild, Lansdale, PA (US)

(73) Assignee: AVO Multi-Amp Corporation, Dallas, TX (US)

( * ) Notice: Subject to any disclaimer, the term of this patent is extended or adjusted under 35 U.S.C. 154(b) by 0 days.

(21) Appl. No.: 16/254,292

(22) Filed: Jan. 22, 2019

(65) Prior Publication Data
US 2019/0227108 A1 Jul. 25, 2019

Related U.S. Application Data

(60) Provisional application No. 62/619,564, filed on Jan. 19, 2018.

(51) Int. Cl.
*G01R 29/20* (2006.01)

(52) U.S. Cl.
CPC .................... *G01R 29/20* (2013.01)

(58) Field of Classification Search
CPC ............ G06F 3/0237; H02M 3/33569; H02M 3/3376; H02M 3/33584; H02M 3/33592; H02M 2001/0064; H02M 3/33546; H02M 7/003; H02M 1/36; H02M 2003/1552; H02M 3/33507; H02J 9/067; H02P 27/06; H02P 9/40; G01R 27/02; G01R 29/20; G01R 31/62; G01R 35/02; G01R 15/185; G05B 19/4105; H01F 29/02
See application file for complete search history.

(56) References Cited

U.S. PATENT DOCUMENTS 2,527,568 A * 10/1950 Murray .................. G01R 29/20
324/726
2,911,591 A * 11/1959 Pritchett ................ G01R 35/02
324/726

(Continued)

OTHER PUBLICATIONS

Iwanusiw, O.W.; "Demagnetizing Transformers with Direct Current"; Dec. 16, 1977; 4 pages.

(Continued)

*Primary Examiner* — Vinh P Nguyen
(74) *Attorney, Agent, or Firm* — Conley Rose, P.C.; J. Robert Brown, Jr.; Joseph J. Funston, III (57) ABSTRACT

A turns ratio meter may be connected to each phase of each set of windings. The excitation voltage used in testing is a DC square wave. The excitation voltage is relatively low, between 1 and 48 volts. The step down and step up testing is performed several times with different voltages and/or frequencies. Excitation losses of the transformer are determined based upon the multiple step down and step up tests. The step down and step up testing can be performed without reconfiguring the test leads on the transformer. The testing is performed on a single phase of the transformer or all three phases of the transformer simultaneously. The turns ratio of the transformer is accurately determined using the results of the step down and step up testing and the calculated excitation losses.

18 Claims, 6 Drawing Sheets

(56) References Cited

U.S. PATENT DOCUMENTS

| | | | | |
|---|---|---|---|---|
| 2,914,729 | A * | 11/1959 | Thompson | G01R 29/20 |
| | | | | 324/726 |
| 4,241,306 | A * | 12/1980 | Bump | G01R 29/20 |
| | | | | 324/726 |
| 4,758,774 | A * | 7/1988 | Crawford | G01R 29/20 |
| | | | | 324/726 |
| 8,553,379 | B2 * | 10/2013 | Kasztenny | H02H 7/045 |
| | | | | 361/36 |
| 9,110,117 | B2 * | 8/2015 | Werelius | G01R 27/2617 |
| 9,671,451 | B2 * | 6/2017 | Lachman | G01R 31/50 |
| 10,203,364 | B2 * | 2/2019 | Lachman | G01R 31/62 |
| 10,224,826 | B2 * | 3/2019 | Iyasu | H02M 3/33507 |
| 10,921,386 | B2 * | 2/2021 | Pabbathi | H01F 27/28 |
| 10,955,490 | B2 * | 3/2021 | Kaufmann | G01R 31/72 |
| 2014/0156212 | A1 | 6/2014 | Li et al. | |
| 2015/0094973 | A1 | 4/2015 | Iwanusiw et al. | |

OTHER PUBLICATIONS

Eltel Industries; "Relaying Current Transformer Analyser"; CTERP-2000; Jan. 6, 2010; 4 pages.

Haefely Test AG; "Operating Instructions 2293 Winding Analyser"; Jul. 2011; 226 pages.

Haefely; "2293 Winding Resistance Meter with One-Time Connection System"; Apr. 8, 2011; 34 pages.

* cited by examiner

SYSTEM AND METHOD FOR MEASURING TURNS RATIO OF A TRANSFORMER

CROSS-REFERENCE TO RELATED APPLICATIONS

This application claims priority to U.S. Provisional Application No. 62/619,564 filed Jan. 19, 2018 by Oleh Iwanusiw, et al. entitled, "Transformer Turns Ratio Measurement System and Method", which is incorporated by reference herein as if reproduced in its entirety.

BACKGROUND

The electrical power system in the United States generates three-phase alternating current (AC) electrical power. Each power phase is 120 degrees out of phase, plus or minus, with the other two power phases. The voltage of any phase oscillates sinusoidally between positive voltage and negative voltage. It is more efficient to transmit electrical power at high voltage levels than at low voltage levels. Electrical power may be generated as three-phase AC power at moderate voltage levels in the 12 thousand volt (kV) to 25 kV range. The voltage level may be stepped up to the 110 kV to 1000 kV range using a transformer for transmission over long transmission lines, in order to decrease transmission line power loss. The transmission line voltage may be stepped down, using a transformer at a substation, to the 12 kV to 35 kV range for local distribution. The local distribution voltage level may be further stepped down through one or more transformer stages to provide 120 volt AC power to the home and office.

Power system transformers may comprise three pairs of wire windings, one pair of windings for each phase. Each pair of wire windings is constructed so that an alternating electric voltage in a primary winding creates a fluctuating electro-magnetic field that couples into the secondary winding, thereby inducing a corresponding alternating electric voltage in the secondary winding. Typically the primary and secondary windings are wound on a common core that improves the efficiency of the transformer by concentrating the electro-magnetic field within the common core, thereby improving the coupling between the primary and secondary windings. In an ideal transformer, the voltage in the secondary winding $V_s$ is proportional to the voltage in the primary winding $V_p$, where the proportionality is mediated by the ratio of the number of wire turns in the secondary winding $N_s$ to the number of wire turns in the primary winding $N_p$: $V_s = V_p(N_s/N_p)$. In an ideal transformer, the current in the secondary winding $I_s$ is proportional to the current in the primary winding $I_p$, where the proportionality is mediated by the ratio of the number of wire turns in the primary winding $N_p$ to the number of wire turns in the secondary winding $N_s$: $I_s = I_p(N_p/N_s)$. The performance of power system transformers may change as insulation of the windings or the magnetic properties of the core deteriorate. This deterioration of the insulation may lead to a dissipation factor (DF) that is greater than zero. In some contexts, the dissipation factor may be referred to as the insulation power factor. In practical power system components, the dissipation factor is greater than zero, but by a tolerable fraction of a percent. For example, a dissipation factor value at 20 degrees C. for a new power distribution transformer winding may be about 0.001. A dissipation factor value of 0.01 may be grounds for an alert or warning. Similarly, the core may have losses in the form of hysteresis or eddy currents. Such losses will change if the core laminations become shorted. Shorted turns on either winding will also cause losses in the form of eddy currents Theoretically, power-out equals power-in in a transformer. However, even good performing transformers may have less than 100% efficiency. The lost power, be it in the insulation of the transformer or in the magnetic circuit of the core, may manifest itself in the form of heat. Power may also be lost through leakage current paths that do not transfer to the secondary winding, but rather through the transformer's insulation back to ground at the power-in source. The ratio of number of turns in the secondary winding and the number of turns in the primary winding may change if a turn shorts at a point of insulation breakdown on either winding. If the transformer is faulty, the lost power may cost money to the electric utility company that operates the transformer. Further, lost power may indicate a more serious problem, for example, overheating, that if left unattended may result in catastrophic damage to or failure of the transformer and loss of power to customers.

A wide variety of power system transformer configurations is known, and some transformers may vary somewhat from the general description above. Typically power transformers are connected in three-phases in either a delta or wye connection. The reasons for choosing a delta or wye configuration may include that wye configurations allow for three independent voltages, while delta configurations allow the windings to combine to provide a common voltage, thus providing greater stability. In a wye configuration there may be an extra node commonly referred to as neutral. Therefore in a wye to wye configuration, there may be eight nodes, while in a delta to delta configuration there may only be six nodes. Some transformers may be single-phase transformers. Some transformers may be auto-transformers. Some transformers may have taps. The external connections to power distribution transformer windings may be provided via bushings. In some embodiments, bushings include ceramic insulators.

Testing of power system transformers may be conducted by connecting a test set to the windings of the power system transformers and exciting the primary winding or the secondary winding with electrical signals, that may be direct current (DC) or alternating current (AC). Testing may be conducted on one transformer phase at a time, or may be conducted concurrently on multiple phases of the transformer.

SUMMARY

Described herein is a system and method for transformer turns ratio measurement. A turns ratio meter may be configured to perform step down testing using a switched DC excitation signal applied to the higher voltage winding. The results of the step down testing may be used to determine characteristics of the transformer, e.g., excitation current, excitation losses, phase angle, etc. Based on the results of the step down testing and the determined characteristics, the turns ratio meter may perform step up testing of the transformer using switched DC applied to the lower voltage winding. The test may be performed without rearranging any cables of the turns ratio meter connected to the transformer. Using the results of the step down and step up testing, refined using the determined characteristics, a more accurate turns ratio may be determined and provided to a tester.

The step up and step down testing may be performed using three phase simultaneous excitation/measurements using a switching matrix to switch between down excitation and up excitation to provide transformer phase angle, turns ratio and core balance. In this process, the collection of multiple ratio measurement data sets, phase angle calculations, core balance calculations, and identification of neutral being present provides the ability to calculate for user presentation more accurate transformer ratio results. The product/instrument control of the implemented excitation and measurement circuitry also supports single phase ratio basic voltage ratio measurement determinations. These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Described herein is a system and method for transformer turns ration measurement. In an embodiment, a turns ratio meter may be connected to each phase of each set of windings. Step down testing may be performed on the transformer followed by step up testing. The excitation voltage used in testing may be a DC square wave. The excitation voltage may be relatively low, between 1 and 48 volts. The step down and step up testing may be performed several times with different voltages and/or frequencies. Excitation losses of the transformer may be determined based upon the multiple step down and step up tests. The step down and step up testing may be performed without reconfiguring the test leads on the transformer. The testing may be performed on a single phase of the transformer or all three phases of the transformer simultaneously. The turns ratio of the transformer may be accurately determined using the results of the step down and step up testing and the calculated excitation losses.

Figure 1:
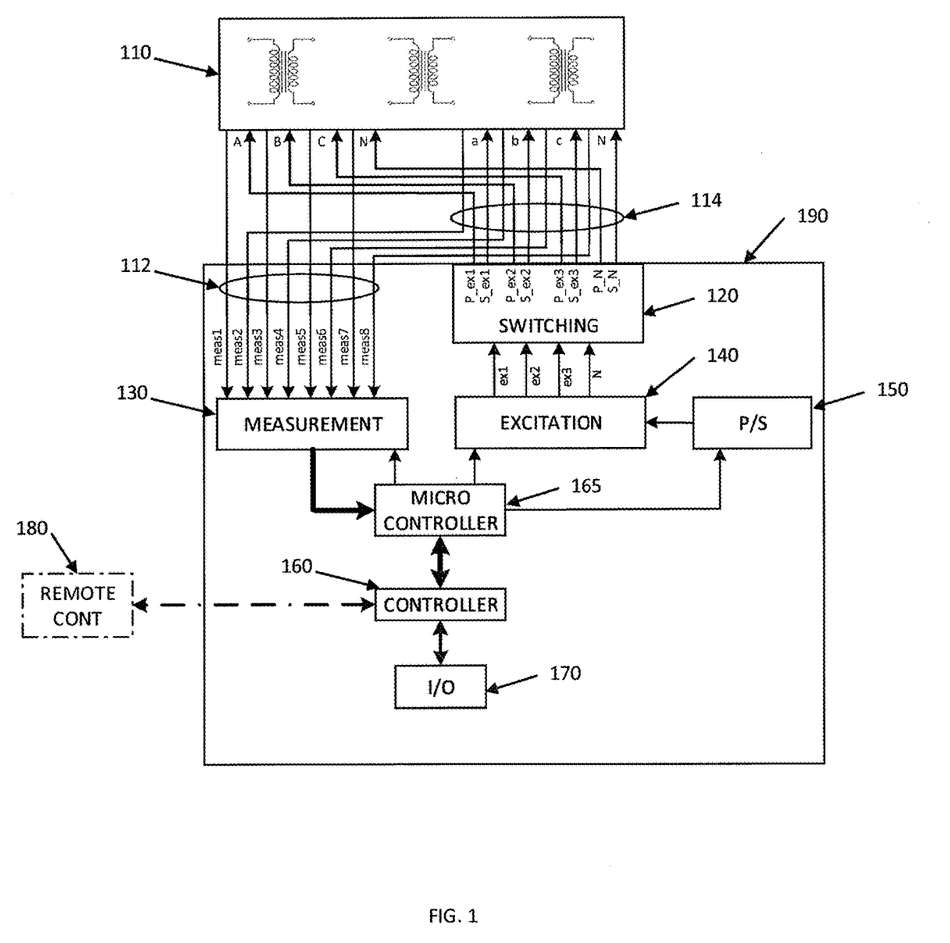
FIG. 1 is a diagram of an embodiment of a transformer turns ratio measurement using a turns ratio meter.

FIG. 1 is a diagram of an embodiment of a turns ratio measurement using a turns ratio meter 190. The turns ratio meter 190 may be self-contained, that is the components for testing may all be contained within a single case. The turns ratio meter 190 may be ruggedized and shielded appropriately to provide service in the harsh electrical environment of a power generation and/or power distribution station and exposed to the weather. During testing, a turns ratio meter 190 may be connected to a transformer 110. The turns ratio meter 190 may be connected to the transformer 110 by connectors and cables. The connector may, for example, be a cannon plug, bushing clamp, or other connector for electrically coupling the turns ratio meter 190 to the transformer 110. The connection provides an electrical path from the turns ratio meter 190 to the transformer 110.

In this embodiment, transformer 110 may be a three-phase transformer. In other embodiments, transformer 110 may be a single phase transformer or a two-phase transformer, or some other electrical component with windings. The transformer 110 may be coupled to the turns ratio tester 190 by measurement connections 112 and excitation connections 114. Excitation connections 114 may be stimulus connections simultaneously connected to each phase and neutral of transformer 110 on both the primary and secondary sides of transformer 110. Measurement connections 112 may be measurement connections connected to each phase and neutral of transformer 110 on both the primary and secondary sides of transformer 110. The measurement connections 112 and excitation connections 114 may be configured as Kelvin connections, e.g., the contacts in measurement connections 112 and excitation connections 114 may be configured to reduce the effect of the resistance of the contacts and wires coupling the transformer 110 and the turns ratio meter 190.

The excitation connections 114 from the transformer 110 to the turns ratio meter 190 may be coupled to a switching matrix 120 within the turns ratio meter 190. The switching matrix 120 may contain switches that are controlled by controller 160 and/or microcontroller 165. The switches may be mechanical switches, transistor switches, or any other type of switch that may be used for switching excitation signals from the turns ratio meter 190 to the transformer 110. The switching matrix 120 may be controlled to cause the turns ratio meter 190 to excite the high side or the low side of the transformer 110 without rearranging cables between the turns ratio meter 190 and the transformer 110.

The switching matrix 120 may also be coupled to an an excitation circuit 140. The connections between switching matrix 120 and excitation circuit 140 may each correspond to a phase or neutral connection to the transformer 110. The switching matrix 120 may be configured to provide single phase excitation signal or simultaneously provide an excitation signal to all three phases of the transformer 110.

Controller 160 and/or microcontroller 165 may control the switching matrix 120 to apply excitation signals received from the excitation circuit 140 to the transformer 110. The excitation circuit 140 may receive electrical power from a power supply 150. The power supply 150 may be a variable power supply or a fixed power supply configured to provide AC or DC signals for use in exciting the transformer 110. Excitation circuit 140 may condition the electrical signals received from the power supply 150 based upon the requirements of transformer 110 or other factors. In some cases, the electrical signals received from the power supply 150 may not require further conditioning.

In some embodiments, the excitation circuit 140 may excite the transformer windings using square wave excitation. The square wave may be a reversible DC square wave. The excitation may be varied from 1 volt to 48 volts, and reversed to −48 volts to −1 volt. The square wave may vary in amplitude based upon the characteristics of the power supply 150 and/or excitation circuit 140. In some embodiments, the excitation circuit 140 may excite the transformer windings using sine wave excitation, e.g., alternating current (AC). In some embodiments, the excitation signal, either AC or switched DC, may be provided at various frequencies, for example the frequency of the excitation signal may equal the power line frequency, harmonics, and/or sub-harmonics of the power line or source (not pictured) connected to the transformer 110.

The excitation circuit 140 may provide single-phase excitation and/or three-phase excitation to the transformer under test. All the signals received from the transformer 110 may be continuously measured by the measurement circuit 130. Controller 160 and/or microcontroller 165 may control the switching matrix 120 to transmit signals received from the transformer 110 to the measurement circuit 130 for measurement. The single-phase excitation may used for single-phase testing and/or three-phase testing. Testing three-phase transformers using single-phase excitation may be accomplished by applying the single-phase excitation to each phase of the transformer, one phase at a time. The single-phase excitation may be applied to one set of windings (e.g., primary) and a resulting voltage may be measured at the other set of windings (e.g., secondary). The turns ratio meter 190 may measure voltage, current, active power, and reactive power using the single-phase excitation.

In an embodiment, the excitation circuit 140 may be configured to provide three-phase excitation. The three-phase excitation may be highly symmetric with respect to magnitude and phase, e.g., each phase is 120 degrees out of phase from the next phase. Three-phase testing using three-phase excitation may be accomplished by simultaneously applying excitation to each phase of the transformer. The three-phase excitation may be applied to one set of windings (e.g., primary) and resulting voltages may be measured at the other set of windings (e.g., secondary). Testing with three-phase excitation allows the transformer to be tested under circumstances that are very similar to circumstances that the transformer would experience under normal operating conditions. Three-phase testing improves the accuracy of measurements of the characteristics of the transformer, e.g. ratio, phase, and/or core loss as experienced while all three phases are excited.

The turns ratio meter 190 may be configured to calculate the symmetrical components of excitation signals applied to each set of windings of the transformer 110. The symmetrical components of the signal may be referred to herein as negative or positive or zero components. Negative components may also be referred to as inverse components and positive components may also be referred to as direct components. Comparing the applied positive sequence voltage of the excited winding of the transformer 110 with the positive sequence voltage of another winding of the transformer 110 may increase the accuracy of the measured turns ratio, as well as any measured phase displacement of the transformer 110. The turns ratio meter 190 may determine problems with the transformer 110 by comparing the applied negative and zero sequence voltage to the excited winding of the transformer 110 with the negative sequence voltage of another winding of the transformer 110.

For example, in a well-balanced three-phase system, the positive sequence is very close to the average of each of the three phases measured individually. The negative sequence of the three-phase system is approximately the average of the differences between each of the three phases individually. Any detection of a negative sequence may indicate a difference between the individual phases, which is indicative of unmatched turn ratios, different core losses, shorted turns, or other problems in a transformer. A negative sequence may be undesirable due to resulting losses of efficiency of the transformer. In some embodiments, detection of a negative sequence above a threshold may be an indicator of the need to replace a transformer under test. The magnitude of the negative sequence component and the zero sequence component may be indicative of a likely problem with the transformer. These values are obtainable from a three-phase test using very symmetrical three-phase excitation.

Input/Output (I/O) component 170 may include input and output devices for interacting with the turns ratio meter 190. For example, I/O component 170 may include a keyboard, touch screen, video display, microphone, speakers, and/or other components for interacting with the turns ratio meter 190, e.g., controlling testing and/or displaying results of testing. The turns ratio meter 190 may be optionally coupled to a printer (not pictured) at a test location, and the test results may be printed out on-location and left with and/or used by an electrical power operating company or other appropriate entity. Results of testing may be stored in a local or remote data store (not pictured) for comparison with later test results. Optionally, a remote control 180 may be used to interact with turns ratio meter 190. For example, a wireless and/or wired connection may be made between remote control 180 and the controller 160. A user may interact with the turns ratio meter 190 from a remote location using the remote controller 180.

The turns ratio meter 190 may be employed for testing power system components other than power system transformers, including instrument transformers, cables, generators, electric motors, rotating machines, batteries, protection relays, circuit breakers, and others, in some cases after making appropriate modifications to the excitation circuit 140, switching matrix 120, and/or measurement circuit 130. The turns ratio meter 190 may further be configured to measure other characteristics of the transformer 110 for use in troubleshooting and maintaining the transformer 110. For example the turns ratio meter 190 may be configured to detect problems with the core and/or windings of the transformer 110.

Figure 2:
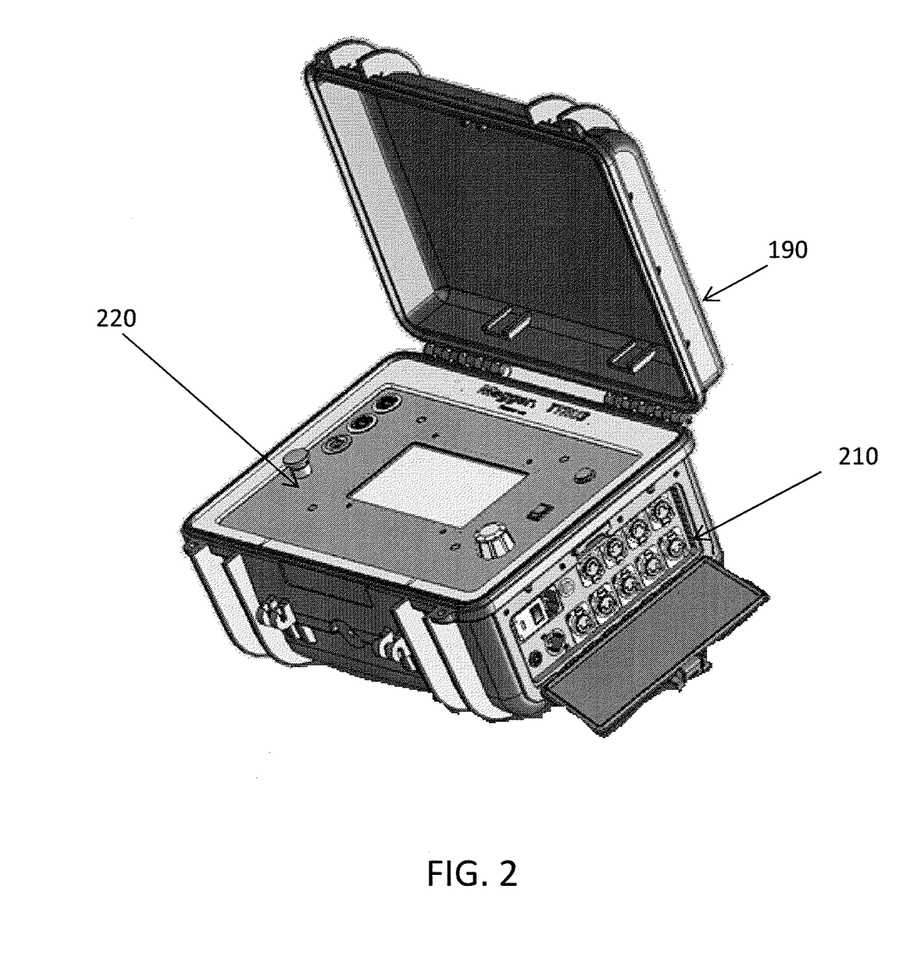
FIG. 2 is a diagram of an embodiment of a turns ratio meter.

FIG. 2 is a diagram of an embodiment of a turns ratio meter 190. The turns ratio meter 190 may include a connection panel 210. The connection panel 210 may include a plurality of connectors for connecting test leads from the turns ratio meter 190 to a transformer under test, e.g., transformer 110. The connection panel 210 may be part of measurement connection 112 and excitation connection 114. There may be one connector on connection panel 210 for each phase of the transformer including neutral. There may also be a connector for a remote controller to interact with the turns ratio meter 190. Further there may be a connector for programming the turns ratio meter 190. The programming may include firmware, operating system, and/or software updates to the turns ratio meter 190. In some embodiments, the connectors may be combined into a single connector or divided among any number of connectors. In some embodiments, the connectors may be physical hard-wired connectors. In some embodiments the connectors may be wireless connections. The turns ratio meter 190 may also include an I/O panel 220. The I/O panel 220 may include various I/O devices. For example, a touchscreen interface, control knob, switches, keyboards, and/or other input/output devices. In some embodiments, there may be other panels and/or the connector panel 210 and I/O panel 220 may be combined in a single panel.

Figure 3:
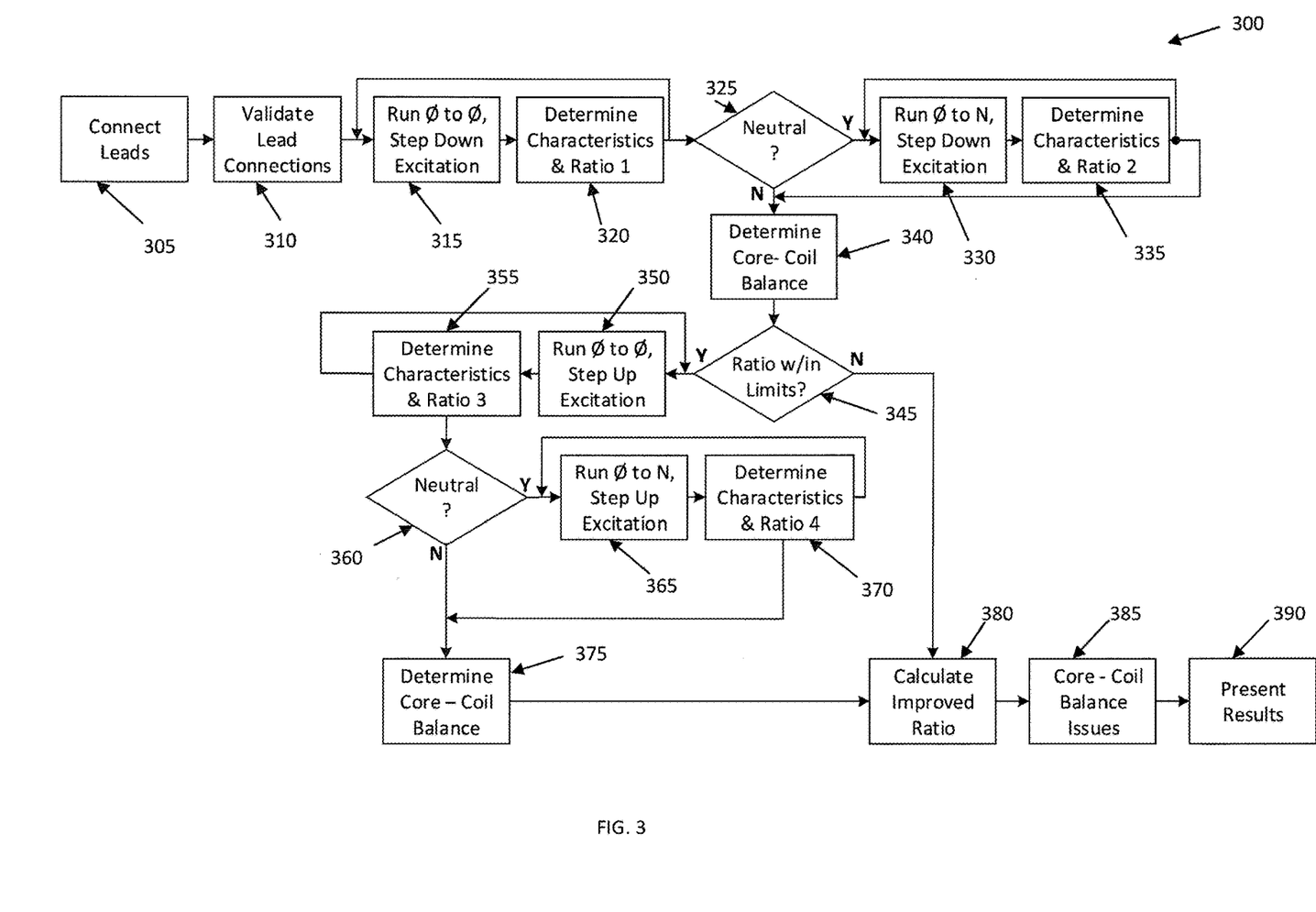
FIG. 3 is a diagram of an embodiment of a method for transformer turns ratio measurement.

FIG. 3 is a flow diagram of an embodiment of a method 300 for transformer turns ratio testing. The method may begin at step 305 when test leads are connected from a transformer turns ratio meter, e.g. turns ratio meter 190, to a transformer under test, e.g., transformer 110. If the transformer is a three-phase transformer, test leads may be connected between each phase and neutral on both the primary and secondary sides of the transformer. The transformer turns ratio meter may perform a setup test as part of step 310. The setup test may validate that the test leads are properly connected between the turns ratio meter and the transformer. The setup test may apply small voltages to the test leads to ensure the transformer turns ratio meter has been properly connected to the transformer under test.

The method may continue at step 315 where the ratio turns meter may perform phase to phase step down testing on the transformer. Step down testing may include applying an excitation signal to the primary windings of a step down transformer and measuring the output at the secondary windings, or applying an excitation signal to the secondary windings of a step up transformer and measuring the output of the primary windings. The excitation signal may be applied to one phase at a time or to all three phases simultaneously. A step down test may apply a voltage as an input to the transformer, and measure a lower, stepped-down, voltage as an output from the transformer. For example, if testing a step down transformer, 20 volts may be applied to the primary windings and 2 volts may be measured at the secondary windings. Based upon a ratio of the input voltage (20 volts), and the measured output voltage (2 volts), the transformer turns ratio may be estimated as 10 to 1.

The excitation signal used for excitation of the transformer during step down testing may be determined in several ways. The excitation signal may be programmed by a user of the turns ratio meter, the excitation signal may be determined by the turns ratio meter based upon characteristics of the transformer entered at the I/O component of the turns ratio meter, and/or the excitation signal may be incrementally increased or decreased within the limits of the excitation and measurement circuits of the turns ratio meter. The characteristics of the transformer entered at the I/O component may be retrieved from a faceplate of the transformer. The step down testing may be repeated several times with varying signal characteristics, e.g. different voltages and/or frequencies, used during each of the repeated step down tests. The step down testing may be accomplished using a square wave, e.g., switched DC, as an excitation signal. A Fourier transform and/or Laplace transform may be used to determine sine wave characteristics of the applied and measured square wave. The sine wave characteristics may be used in determining the transformer characteristics, e.g., excitation losses. Accurate transformer characteristics allow for corrections to be made to the measured output of the transformer under test and improve the accuracy of the transformer turn ratio estimate.

At step 320, the turns ratio meter may determine transformer characteristics of the transformer under test that affect measurements taken during testing. The turns ratio meter may be configured to apply corrections to the measurements taken during the step up and step down testing based on the transformer characteristics. For example, during excitation of the transformer, excitation loses, or no-load losses, may be experienced. Excitation losses may include core loss, dielectric loss, and copper loss in the windings due to the excitation current. The excitation losses may be the result of the current needed to energize the core of the transformer. The excitation losses may remain constant whether or not a load is attached to the transformer. Excitation losses may be determined by performing step up and/or step down testing using several different excitation voltages. Based on the results of the several tests using the varying excitation voltages, a correction factor may be determined to account for excitation losses of the transformer.

Also at step 320, the turns ratio meter may estimate the turns ratio of the transformer under test using the measurements from the step down test and the determined transformer characteristics, e.g., excitation losses, phase angle of the various phases, and/or other characteristics that may affect the accuracy of the measurements.

At step 325, the turns ratio may determine if a neutral connection has been made between the turns ratio meter and the transformer under test. If a neutral connection is not present, the test continues at block 340. If a neutral connection is present, the test may continue at step 330, where step down testing is performed from phase to neutral. At step 335, the turns ratio meter may use the results of phase to neutral step down testing to update the characteristics of the transformer that were previously determined at step 320 and update the estimated turns ratio that was previously determined at step 320.

At step 340, the turns ratio meter may use the results of the previous step down testing to determine a core-coil balance of the transformer. Core-coil balance determination may include calculating the positive, negative, and zero components of the measured output of the step down testing. The core coil-balance may be used to determine if there are problems in the windings or core of the transformer under test.

At step 345, the turns ratio meter may determine whether the previously estimated turns ratio is below a safety threshold for step up testing. The safety threshold may be determined based upon a maximum voltage that may be measured by the turns ratio meter. During step up testing, large voltages may result based upon the turns ratio of the transformer under test and the voltage applied. If the turns ratio is relatively high, and a relatively high voltage is applied to the transformer under test, the voltage that results during step up testing may be too high for the turns ratio meter to measure safely. The resulting high voltage may cause damage to the turns ratio meter and/or result in unsafe working conditions for a user of the turns ratio meter.

If the estimated turns ratio of the transformer under test is above the safety threshold, the method continues at step 380 where an improved turns ratio is calculated based upon the results of previous step down testing and the core-coil balance determined at step 340. At step 385, any core-coil balance issues may be determined based on the core-coil balance determined at step 340 At step 390, results of the testing are provided to a user of the turns ratio meter. The results may include any combination of phase angle of the transformer, an estimated turns ratio of the transformer, any core-coil balance issues, or any other data gathered and/or calculated during the testing of the transformer.

If the estimated turns ratio of the transformer under test is below the threshold, the method continues to step 350. At step 350, a voltage for step up testing is determined. The voltage may be determined based upon the estimated turns ratio determined during the step down testing and/or a maximum voltage that may be safely measured by the turns ratio meter.

Also at step 350, phase to phase step up testing of the transformer under test is performed. Step up testing may include applying an excitation signal to the primary windings of a step up transformer and measuring the output at the secondary windings, or applying an excitation signal to the secondary windings of a step down transformer and measuring the output of the primary windings. A step up test may apply a voltage as an input to the transformer, and measure a higher, stepped-up, voltage as an output from the transformer. For example, if testing a step down transformer, 2 volts may be applied to the secondary windings and 20 volts may be measured at the primary windings. Based upon a ratio of the input voltage (2 volts), and the measured output voltage (20 volts), the transformer turns ratio may be estimated as 10 to 1. The excitation signal may be applied to one phase at a time or to all three phases simultaneously. The voltage for step up testing may be incrementally increased or decreased within the limits of the excitation and measurement circuits of the turns ratio meter. The step up testing may be repeated several times with varying signal characteristics, e.g. different voltages and/or frequencies, used during each of the repeated step up tests. The step up testing may be accomplished using a square wave, e.g., switched DC, as an excitation signal. A Fourier transform and/or Laplace transform may be used to determine sine wave characteristics of the applied and measured square wave. The sine wave characteristics of the step up testing may be used in conjunction with the sine wave characteristics determined during step down testing to improve the accuracy of the calculations of the transformer characteristics, e.g., excitation losses.

At step 355, the turns ratio meter may determine transformer characteristics of the transformer under test that affect measurements taken during testing and determine the turns ratio of the transformer under test using any combination of the measurements from the step up test performed at step 350, the determined transformer characteristics, e.g., excitation losses, and/or the results of the step down testing. The transformer characteristics determined during step down testing may be updated based on the results of the step up testing. In some embodiments, the transformer characteristics determined during step down testing may be used during step up testing for improved accuracy. The turns ratio may be further determined by taking an average of the turns ratio determined at step 320, step 335 and/or the turns ratio determined as a result of the step up test at step 355.

At step 360, the turns ratio may determine if a neutral connection has been made between the turns ratio meter and the transformer under test. If a neutral connection is not present, the test continues at block 375. If a neutral connection is present, the test may continue at step 365, where step down testing is performed from phase to neutral. At step 370, the turns ratio meter may use the results of phase to neutral step down testing to update the characteristics of the transformer that were previously determined at step 355 and update the estimated turns ratio that was previously determined at step 355.

At step 375, the turns ratio meter may use the results of the previous step down testing to determine a core-coil balance of the transformer. Core-coil balance determination may include calculating the positive, negative, and zero components of the measured output of the step down testing. The core coil-balance may be used to determine if there are problems in the windings or core of the transformer under test.

The method continues at step 380 where an improved turns ratio is calculated based upon the results of previous step down testing and the core-coil balance determined at step 340. At step 385, any core-coil balance issues may be determined based on the core-coil balance determined at step 340. At step 390, results of the testing are provided to a user of the turns ratio meter. The results may include any combination of phase angle of the transformer, an estimated turns ratio of the transformer, any core-coil balance issues, or any other data gathered and/or calculated during the testing of the transformer.

In some embodiments, each time step up and step down testing is performed, the results of that particular test may be used to refine the determined transformer characteristics which may be used to further improve the accuracy of the turns ratio measurement.

Figure 4:
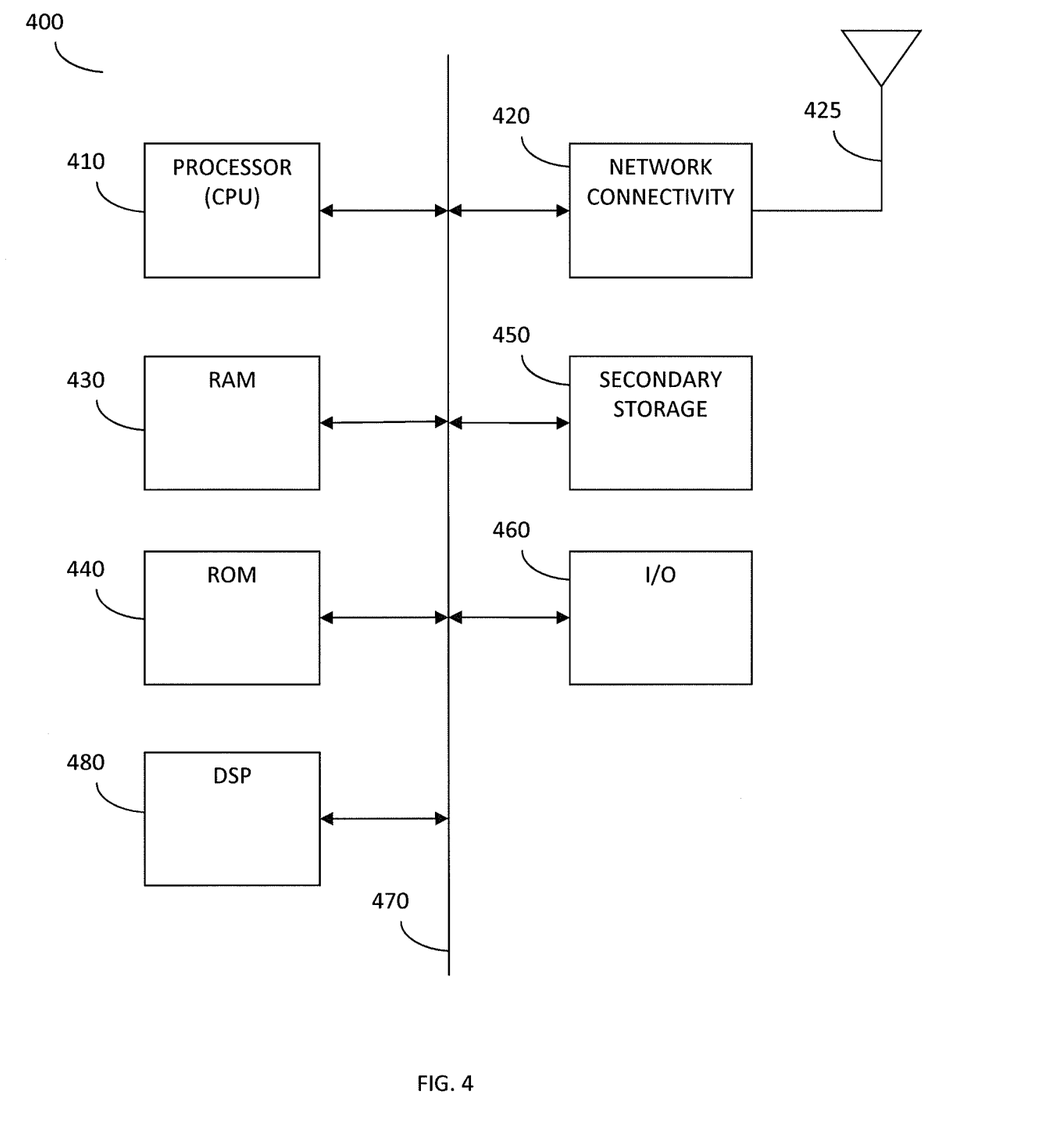
FIG. 4 is a diagram of an embodiment of a system for transformer turns ratio measurement.
Figure 5:
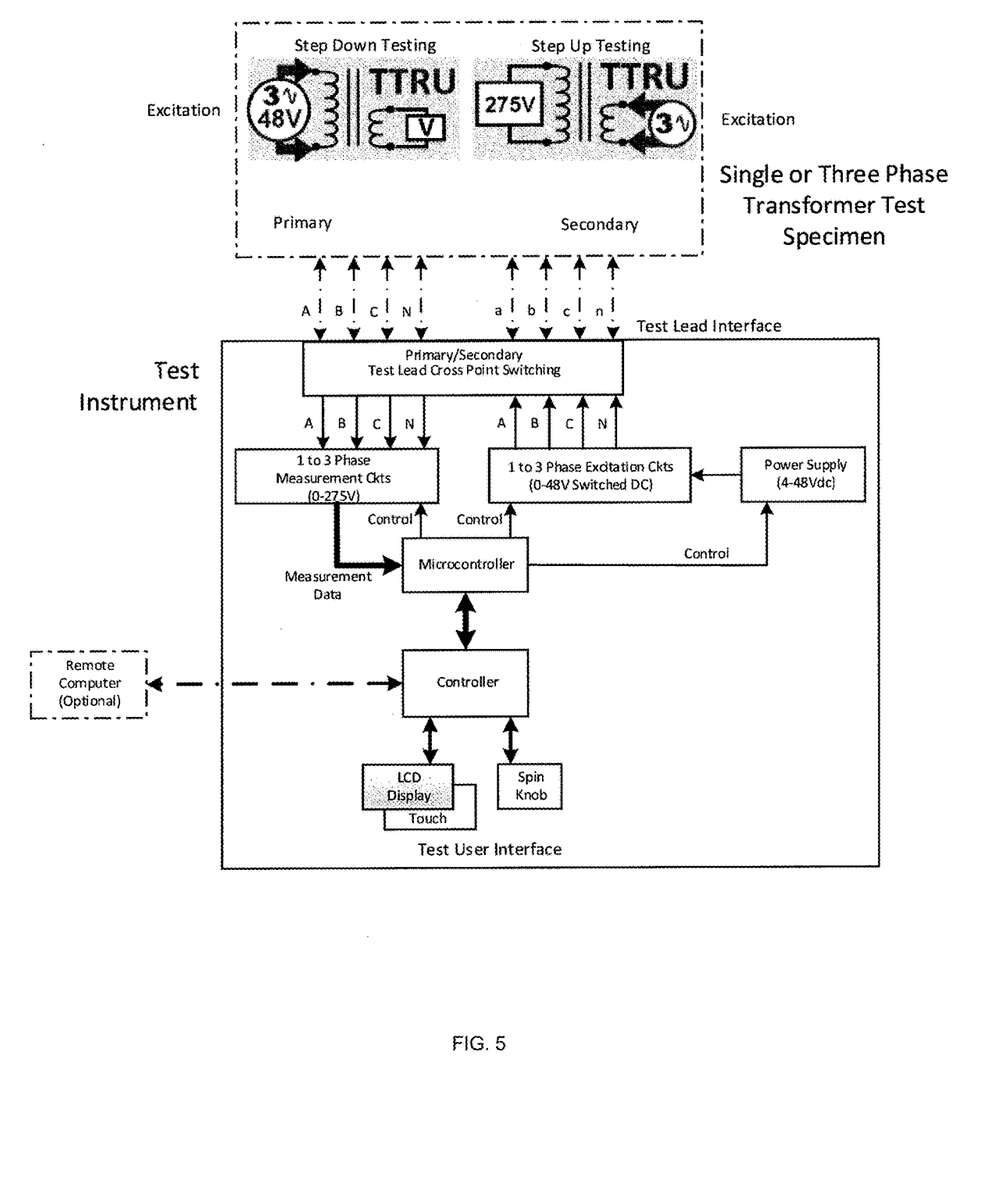
FIG. 5 is a diagram of an embodiment of a turns ratio meter.
Figure 6:
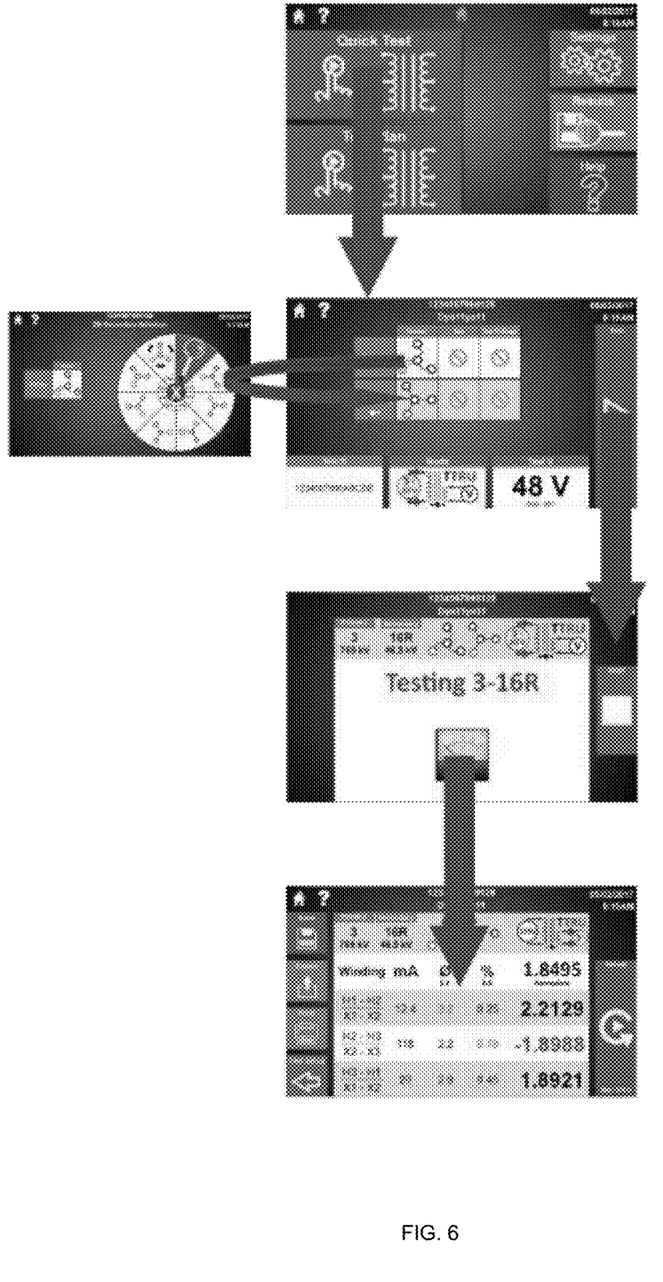
FIG. 6 is an embodiment of a flow diagram of a user interface.

FIG. 4 is a diagram of an embodiment of a system 400 that includes a processor 410 suitable for implementing one or more embodiments disclosed herein, e.g., controller 160 and/or I/O components 170. The processor 410 may control the overall operation of the system.

In addition to the processor 410 (which may be referred to as a central processor unit or CPU), the system 400 might include network connectivity devices 420, random access memory (RAM) 430, read only memory (ROM) 440, secondary storage 450, and input/output (I/O) devices 460. These components might communicate with one another via a bus 470. In some cases, some of these components may not be present or may be combined in various combinations with one another or with other components not shown. These components might be located in a single physical entity or in more than one physical entity. Any actions described herein as being taken by the processor 410 might be taken by the processor 410 alone or by the processor 410 in conjunction with one or more components shown or not shown in the drawing, such as a digital signal processor (DSP) 480. Although the DSP 480 is shown as a separate component, the DSP 480 might be incorporated into the processor 410.

The processor 410 executes instructions, codes, computer programs, or scripts that it might access from the network connectivity devices 420, RAM 430, ROM 440, or secondary storage 450 (which might include various disk-based systems such as hard disk, floppy disk, or optical disk). While only one CPU 410 is shown, multiple processors may be present. Thus, while instructions may be discussed as being executed by a processor, the instructions may be executed simultaneously, serially, or otherwise by one or multiple processors. The processor 410 may be implemented as one or more CPU chips and may be a hardware device capable of executing computer instructions.

The network connectivity devices 420 may take the form of modems, modem banks, Ethernet devices, universal serial bus (USB) interface devices, serial interfaces, token ring devices, fiber distributed data interface (FDDI) devices, wireless local area network (WLAN) devices, radio transceiver devices such as code division multiple access (CDMA) devices, global system for mobile communications (GSM) radio transceiver devices, universal mobile telecommunications system (UMTS) radio transceiver devices, long term evolution (LTE) radio transceiver devices, worldwide interoperability for microwave access (WiMAX) devices, controller area network (CAN), domestic digital bus (D2B), and/or other well-known devices for connecting to networks. These network connectivity devices 420 may enable the processor 410 to communicate with the Internet or one or more telecommunications networks or other networks from which the processor 410 might receive information or to which the processor 410 might output information. The network connectivity devices 420 might also include one or more transceiver components 425 capable of transmitting and/or receiving data wirelessly.

The RAM 430 might be used to store volatile data and perhaps to store instructions that are executed by the processor 410. The ROM 440 is a non-volatile memory device that typically has a smaller memory capacity than the memory capacity of the secondary storage 450. ROM 440 might be used to store instructions and perhaps data that are read during execution of the instructions. Access to both RAM 430 and ROM 440 is typically faster than to secondary storage 450. The secondary storage 450 is typically comprised of one or more disk drives or tape drives and might be used for non-volatile storage of data or as an over-flow data storage device if RAM 430 is not large enough to hold all working data. Secondary storage 450 may be used to store programs that are loaded into RAM 430 when such programs are selected for execution.

The I/O devices 460 may include liquid crystal displays (LCDs), touch screen displays, keyboards, keypads, switches, dials, mice, track balls, voice recognizers, card readers, paper tape readers, printers, video monitors, or other well-known input/output devices. Also, the transceiver 425 might be considered to be a component of the I/O devices 460 instead of or in addition to being a component of the network connectivity devices 420.

Transformer Ratio Measurement

Measuring voltage ratio and converting to transformer turns ratio is influenced by practical issues, such as cores whose permeability and loss changes with applied voltage and causes conversion errors. This is especially troublesome when testing three-phase transformers using single-phase excitation. Three-phase transformers typically use cores more efficiently than do single-phase transformers, thus the loss and permeability effects may be reduced, provided three-phase excitation is employed. Some advantages of using three-phase excitation for ratio measurement of three-phase transformers include reduced dependence on test voltage, ability to identify transformer's configuration, ability to measure directly the ratio and phase shift of phase shifting transformers, and ability to provide additional information regarding the balance of the phases, shorted turns, and excessive core loss.

The measurement of turns ratios is used as a tool during manufacturing as well as planned maintenance procedures for identifying problems with power and distribution transformers. Changes in ratios can be indicative of problems within the transformer such as turn-to-turn insulation failure, interwinding insulation failure, or core structure insulation failure. To identify such failures, it is important to measure transformer turns ratios consistently and accurately.

Traditionally, transformer turns ratios were measured using transformer ratio-arm bridges. One such device measures the ratio in the traditional European "Step-Down" connection, another device measures the ratio in the traditional American "Step-Up" connection. These manual instruments use a phase sensitive null detector which allows for an easy way to balance the ratio dials. No phase reading was provided by these original instruments.

Phase readings are also important in identifying problems with transformers, thus subsequent instruments would provide a phase reading. Many current instruments provide a phase as well as ratio reading.

The next step in the evolution of the transformer ratiometer or transformer turns ratiometer is three-phase excitation for the measurement of turns ratios of three-phase transformers. Such instruments provide improved tools for identifying problems on three-phase transformers. These tools are more sensitive, excitation voltage independent, and are not available for single-phase excitation test equipment.

In the following paragraphs, errors of determining turns ratio based on the measurement of voltage ratio are discussed. Such errors may be introduced by the characteristics of the test specimen and by its configuration or connection to the measuring instrument. These errors can be viewed as "systematic errors" and will be present in addition to any errors that the test set itself may introduce.

A basis for transformer turns ratio measurement is the assumption that all of the magnetic flux within the transformer will be linking the windings being measured. Using this assumption, the transformer turns ratio will be equal to the voltage ratio as measured on the windings in question.

As the above assumption is in error due to leakage flux, an approximate turns ratio of a transformer can be determined by exciting the core of the transformer and measuring the voltages of the two windings. Such a measurement will be in error that is inversely proportional to the coupling coefficient between the windings. Also, such a measurement assumes that the windings are not loaded, that is—carry no current.

Practical measuring circuits may require the core to be excited. Such excitation may be provided by applying excitation to any winding on the transformer. The excited winding may be the high voltage winding, in which case the circuit works in a step down" mode. If the excited winding is the low voltage winding, then the circuit works in the step up mode. Such practical connections may present loading on the winding. The effect of various connections will be examined below.

High Voltage Excitation Connection

This is the step down connection. The excitation is applied to the high voltage (HV) winding and the turns ratio is determined from the voltage ratio as measured on the HV and the low voltage (LV) winding. As the HV winding carries magnetizing current, there may be an error in the measurement. The error is proportional to the excitation current multiplied by the HV winding resistance. The in-phase component of the excitation current may cause a positive ratio error, while the quadrature component may cause a negative phase error. Another important factor is the coupling coefficient. As the coefficient is typically less than 1, it may case a positive ratio error. Also of concern are the eddy currents within the core or shorted turns on the core. These may cause a negative phase error.

Low Voltage Excitation Connection

This is the step up connection. The excitation is applied to the LV winding and the turns ratio is determined from the voltage ratio as measured on the HV and the LV winding. As the LV winding carries magnetizing current, there may be an error in the measurement. The error may be proportional to the excitation current multiplied by the LV winding resistance. The in-phase component of the excitation current may cause a negative ratio error, while the quadrature component may cause a negative phase error. Another factor is the coupling coefficient. The coupling coefficient between the HV and LV windings is not the same as between the LV and HV windings. As the coefficient is typically less than 1, it may case a negative ratio error. Also of concern are the eddy currents within the core or shorted turns on the core. These may cause a negative phase error.

Excitation Voltage and Frequency

Some standards specify the use of a voltage no higher than the rated voltage and a frequency no lower than the rated frequency of the test specimen. Typically, there is no mention in the standards as to the wave shape of the excitation signal. Using a frequency higher than the rated frequency may be advantageous as it typically reduces excitation losses and improves coupling between the windings thus reducing errors. There is also no requirement for limiting the excitation to a sinusoidal voltage, other wave shapes may work equally well, for example, a square wave. If good accuracy in ratio and phase departure are desired, excitation other than a sine wave may require signal processing in order for the results to be responsive to the fundamental of the excitation voltage. High accuracy turns ratio measurements are improved by tight coupling between windings, and tight coupling depends, in part, on the permeability of the core. As the permeability of the core increases with an increase in excitation voltage, there may be a tendency to use a higher test voltage for determining the turns ratio from the voltage ratio.

Discussion on Single-Phase Ratio Measurements

As the ratio errors due to excitation and coupling discussed above are positive for HV excitation and negative for LV excitation, there may be cancellation if the HV excited reading was averaged with the LV excited reading. Unfortunately, this cancellation is typically only partially effective. Cancellation is only partial because the HV excitation losses may not be the same as the LV excitation losses. Also, the coefficient of coupling between the HV and the LV winding may not be the same as the coupling between LV and the HV windings. This may be due to the different positioning of the windings with respect to the core. As mentioned above, the voltage ratio errors due to excitation losses may be influenced by the test voltage. For efficient transformers, such as those meeting the department of energy (DOE) standard efficiency levels of 2007, the errors due to excitation losses are estimated at ~0.005% at rated voltage, increasing to ~0.02% at 1% of rated voltage, and ~0.04% at 0.1% of rated voltage.

Another important factor in addition to the influence of excitation losses on turns ratio accuracy is the influence of the coupling coefficient on the accuracy of the voltage ratio measurement. The coupling coefficient depends, at least in part, on the geometry of the windings and the permeability of the core. As the permeability of the core decreases with a reduction in the excitation voltage, so does the coupling coefficient. The coupling coefficient is also smaller for high voltage transformers due in part to providing adequate space for insulation. Measurements have shown that the ratio error for power transformers typically increases by ~0.03% when testing at 1% of rated voltage, and by ~0.06% when tested at 0.1% of rated voltage as compared to a test at rated voltage. Combining the two effects that depend on excitation voltage, the ratio error may increase by ~0.05% when testing at 1% of rated voltage and ~0.1% when testing at 0.1% of rated voltage. Some transformers are labelled "high impedance". These are usually high voltage transformers used on power networks to limit short circuit currents. These transformers typically have a lower coefficient of coupling and will exhibit larger ratio error influences due to excitation voltage. The rating of the transformer under test can be used to apply corrections to improve the accuracy of the voltage ratio measurement being converted to the transformer turns ratio.

In addition to the phase error caused by excitation loss, there may be additional phase error present in the ratio determination. These additional phase errors may be due to the eddy currents within the core. The better the core, the lower the eddy currents, the lower the phase shift. Typically, this phase shift is in the range of 0.03 to 0.10 degrees. The phase shift may also be caused by other eddy currents within the assembly. Being sensitive to shorted turns, grounded core-bolts, and similar, the phase shift is a good indicator of problems within a transformer.

Single-Phase Measurements of Three-Phase Transformers.

Three-phase power transformers present numerous turns ratio measuring challenges. One such challenge being that there are a variety of transformer configurations, namely wye (Y), wye-neutral (Yn), delta (D), zig-zag (Z), zig-zag-neutral (Zn) and various combinations between them. Not all of these configurations are used on a power system, but the combinations of the above amount to 25 distinct possible configurations. In addition to this, there are the transformers with tertiary windings. Each configuration has an optimal or correct method used to measure their turns ratio.

In some approaches, the turns ratio of all of these transformers were measured using single phase excitation. Some of the configurations can have their turns ratio measured using only one connection, while other configurations can have their turns measured using two different connections. The latter may result in two different answers and presents a problem of deciding which of them is correct. To illustrate the problems of single phase excitation measurements, the measurements of the more popular configurations are analyzed below.

Yy Transformers

When measuring the ratio of a three-phase transformer, one approach is to pick a connection that energizes one phase of the transformer and then measure the voltage ratio of the turns associated with that phase. For example, on a Ynyn configuration the phase-to-neutral connection of each winding may be measured. Such a connection would provide a ratio for each phase—A, B, and C. There is also the possibility of measuring the ratio using the line-to-line connection of each winding, which would provide a ratio for a combination of phases, namely—AB, BC, CA. The difference in ratio readings between these connections is typically not very large and may be due to the differences in the excitation losses and coupling between all the windings. When connected phase-to-neutral the test set energizes only one leg of the core assembly at 100%, while the other two legs are energized at approximately 50% each. For line-to-line excitation, two of the phases are energized at 100%, with the third phase sitting idle at ~0%. The voltage ratio measurement using the line-to-line excitation may provide a more accurate representation of the turns ratio and is typically less sensitive to excitation voltage than the line-to-neutral excitation connection.

Yd Transformers

A Ynd transformer presents a challenge due to the Delta connection which will carry current when the transformer is excited single-phase, be it line-to-neutral or line-to-line. This condition breaks one of the rules for determining the proper turns ratio by measuring the voltage ratio, the winding is loaded. Examining the line-to-neutral excitation situation, the single excited winding within the delta is supplying excitation to the other two windings. The situation is different with line-to-line excitation, where two of the delta windings are supplying excitation to the third winding. As there is current circulating within the delta, this causes loading and therefore errors due to loading. The loading with the line-to-line excitation is considerably less than the loading with line-to-neutral excitation, thus the line-to-line excitation provides a more accurate voltage ratio reading. The loading on the delta winding make the connections more sensitive to excitation voltage, with the line-to-neutral excitation being considerably more sensitive.

The alternative to dealing with the "loaded delta" connection, would be to test the transformer using the step up connection, namely treat the Yd transformer as a Dy transformer. As explained herein, this connection does not load the delta, thus its accuracy is not influenced as much by the excitation voltage.

Thus, when testing a Yd transformer, one approach is to test it as a Dy transformer in the step up connection for accurate voltage ratio measurement. Alternatively, the line-to-line excitation, with a line-to-line short, of the transformer may be used. The line-to-neutral excitation may not be used as it loads the delta winding, and as a result is excitation voltage dependent.

Yz Transformers

In testing a Ynzn, Yzn transformer, the problem of turns ratio measurement is similar to that of the Ynd connection. As each phase of the Z winding consists of components from two phases, line-to-neutral excitation may not be used to test ratio. However, line-to-line excitation may be used. Thus, exciting the transformer line-to-line, automatically excites two phases similarly to that of a Yy transformer. The voltage ratio in this connection is an accurate measure of the turns ratio, very similar to the voltage ratio of a Yy transformer connected line-to-line.

During manufacturing each of the windings of a Z connection may be measured separately. This can be accomplished by using the line-to-neutral connection, or the line-to-line connection with a line-to-line short. Similarly to other connections, the line-to-line connection excites two limbs of the transformer under test and is much less voltage dependent.

Dy and Dz Transformers

Measuring turns ratio on Delta high voltage transformers, be they Dy, Dyn, or Dzn, typically presents one choice when exciting the transformer, that is line-to-line excitation with line-to-line shorting. The shorting can be also applied on the secondary side, but this presents a load on the measured winding, thus affecting the accuracy of the measurement. It should be noted that with the delta being on the high side, and using the step-down connection, the delta is not loaded and improved accuracy between the voltage ratio and the turns ratio can be obtained.

Tertiary Delta Windings

A primary function of the tertiary delta winding is to improve the symmetry of the three-phase system, in particular to reduce the amount of negative sequence component. The negative sequence component is typically caused by single-phase loads and unequal impedances of line conductors. In some approaches, all transmission lines are transposed so that all line conductors will have the same impedance, resulting in little or no negative sequence component being generated.

However, tertiary delta windings are of reduced capacity, typically 20-30% of the transformer. When testing the Yd ratio on a typical Ynynd transformer, the tertiary acts like a normal delta connection. The tertiary is thus loaded and being under-powered (presenting a higher impedance), causes larger errors. A measurement of the Yd ratio on a tertiary winding, with a 20% rating, may have a five times larger test voltage influence than the influence on a regular Yd transformer. Therefore, such tertiary windings may be tested using three-phase or line-to-line excitation as this connection presents the least loading on the delta. The turns ratio may be measured using the step up configuration, which presents no loading on the delta winding.

A problem with ratio testing of tertiary delta windings may crop up when the delta is loaded with another transformer (typically Zy) to provide station service load. When internally connected to the delta winding, the service transformer draws excitation current from the delta winding when the HV winding is excited for ratio measurement. This may cause excessive measurement errors. In this case, ratio measurement may excite the delta for the Yd ratio measurement in the step up configuration and at the same time the Zy ratio in the step down configuration.

Table 1 presents approximate values of ratio errors as a function of test voltage for different connections of three-phase transformers. Reduction in voltage influence for transformers excited two-phase and three-phase may be realized.

TABLE 1

| | Ratio error (%) as a function of excitation voltage | | | | | | |
|---|---|---|---|---|---|---|---|
| V (%) | 1Φ-1Φ | 3Φ-3Φ | 2Φ-3Φ | 1Φ-3Φ | 3Φ-D | 2Φ-D | 1Φ-D |
| 100 | 0.006 | 0.004 | 0.005 | 0.01 | 0.01 | 0.02-0.03 | 0.04-0.06 |
| 10 | 0.012 | 0.008 | 0.01 | 0.02 | 0.02 | 0.04-0.06 | 0.08-0.12 |
| 1 | 0.024 | 0.016 | 0.02 | 0.04 | 0.04 | 0.08-0.12 | 0.16-0.24 |
| 0.1 | 0.048 | 0.032 | 0.04 | 0.08 | 0.08 | 0.16-0.24 | 0.32-0.48 |
| 0.01 | 0.096 | 0.064 | 0.08 | 0.16 | 0.16 | 0.32-0.48 | 0.64-0.96 |
| 0.001 | 0.192 | 0.128 | 0.16 | 0.32 | 0.32 | 0.64-0.48 | 1.28-1.92 |

Table 1 was assembled from measurements using different instruments operating at different voltages and measuring a variety of transformers. In table 1, V (%)=Excitation voltage in % of rated voltage; 1ϕ-1ϕ=Single-phase excitation of a single-phase transformer; 3ϕ-3ϕ=Three-phase excitation of a three-phase transformer; 2ϕ-3ϕ=Two-phase excitation of a three-phase transformer; 1ϕ-3ϕ=Single-phase excitation of a three-phase transformer; 3ϕ-D=Three-phase excitation of a three-phase transformer with a tertiary delta; 2ϕ-D=Two-phase excitation of a three-phase transformer with a tertiary delta; and 1ϕ-D=Single-phase excitation of a three-phase transformer with a tertiary delta.

Single-Phase Measurements of Three-Phase transformers

Accuracy of turns ratio determination based on voltage ratio measurements may be subject to influences and connections as discussed above. Based on this information, a table of voltage influences on different connections may be provided, e.g., table 1. Thus, a connection for the most accurate measurement may be selected. Improved accuracy of turns ratio determination based on the voltage ratio measurement may be achieved based on the following conditions: excite test specimen three-phase or line-to-line; if required, apply shorts on the excited winding; and measure transformers with delta connected secondary windings in the step up configuration. The foregoing list of conditions is not meant to be exhaustive and other conditions may contribute to improved accuracy of turns ratio determination.

Three-Phase Testing

In single-phase testing of three-phase transformers, different connections may provide voltage ratios that are very close to the turns ratios, some with larger errors and some with smaller errors. Voltage ratio measurements which excite only one phase of a three-phase transformer are typically subject to larger errors and are more sensitive to excitation voltage than a voltage ratio measurement that excites two phases of the transformer. Thus a voltage ratio measurement that excites all three-phases may provide even more accurate turns ratio based on the voltage ratio and such a measurement may have the smallest excitation voltage influence of the three options (single-phase, two-phase, or three-phase excitation).

In the case of single phase excitation, the one excited phase has to supply the excitation losses for the whole core, while in the case of two-phase excitation, the loss is shared by the two phases. The situation may be further improved with three-phase excitation, where each phase supplies its share of the excitation loss. Further, in three-phase excitation the voltage ratio depends not only on the excitation and coupling between the windings of one phase, but also on the excitation and coupling between all of the windings on all of the phases of the transformer.

A three-phase, three-wire, excitation system combined with a multi-channel measuring system that is capable of measuring line-to-line and line-to-neutral voltages may be used as a three-phase transformer ratiometer. Such a system can excite Delta, Wye, or Zig-zag transformers and measure voltages and determine their phase positions with high accuracy. Thus, the instrument may identify any of the many three-phase connections used on three-phase power transformers. Further, such a system may perform any of the appropriate single-phase measurements while being excited three-phase. The system, therefore, not only determines the ratios of the various phases, but also provides a very accurate on-line comparison between the various phases. Measurements on a variety of transformer configurations, and sizes, indicated that the measurements are not only accurate, but also less sensitive to excitation voltage than any single-phase excitation connections of a three-phase transformer. In addition to all of the above, the three-phase measurement system is ideal for measuring the ratio and phase shift of phase-shifting transformers or of transformers with variable phase shifts. The precise ratios and phase shifts are measured quickly and directly.

Symmetrical Components

A three-phase measurement system is capable of providing additional information pertaining to the health and operation of the transformer under test. Whereas the single-phase excitation tests would provide three ratios and three phase angle errors, the three-phase system, in addition to three ratios and phase angle errors, provides three primary voltages associated with their phase angles, as well as three secondary voltages associated with their phase angles. This information allows determination of the symmetrical components of the transformer's excitation voltage as well as that of the transformer's response.

Once symmetrical components are determined, the "ratio of the transformer" is calculated from the ratio of the positive (+) sequence components and the phase error is determined from the difference between the phases of the positive (+) sequence components. Continuing, with the transformer being a linear device, it should transform voltage and current linearly according to the laws of physics. As these laws apply equally to the symmetrical components, a comparison of the symmetrical components on the secondary side with the components on the primary side provides valuable information as to the proper functioning of the transformer. Analysis of three-phase transformers shows that an incorrect number of turns on any of the windings (incorrect turns ratio) or excessive core loss on one of the phases will result in symmetrical distortion, generation negative (−) sequence on the secondary winding. The generation of negative sequence is more sensitive and accurate to ratio unbalances than the comparison of individual ratios and phase errors. This provides the tester with additional valuable information that pertains to the health of the transformer.

Three-Phase Accuracy Improvements

Three-phase excitation provides designed core excitation for proper operation of the transformer and thus is more suitable for test applications. As accurate ratio measurements depend not only on the excitation of the phase being tested, but also on the coupling between all of the windings on a transformer assembly, three-phase excitation provides the same inter-winding coupling during ratio measurements as would be encountered during service conditions.

Three-phase excitation can be used to excite the hi-side windings of the transformer for step-down measurements, or to excite the lo-side windings for the step-up measurements. In either case, the measurements may provide the three-phase ratio and phase shift; per-phase ratio and phase shift; and degree of negative sequence distortion. Three-phase measurements provide improved information that relates to the health of the transformer relative to single-phase ratio measurements conducted using single-phase excitation.

As for single-phase ratio measurements using single-phase excitation, such measurements may be conducted using the line-to-line connection which excites two phases. Single-phase ratio measurements using the line-to-neutral connection, which excites only one phase, may be used with the caveat that these measurements are test voltage dependent. Single-phase ratio measurements using the line-to-neutral connection, which excite only one phase, with a delta secondary test winding are test voltage dependent as the delta winding is loaded and no longer qualifies for ratio measurements.

Embodiments described herein may include any combination of the following features: uses "reversible DC" (square-wave) excitation over a range of 1-48 volts; capable of exciting the sample at power line frequency, its harmonics or its sub-harmonics; provides single-phase excitation for single-phase or three-phase test samples; provides measurements of voltage, current, active power and reactive power of single-phase excitation; the instrument can conduct tests on three-phase transformers by applying single-phase excitation, phase-by-phase, to one set of windings and measuring the resulting voltages in the other set of windings; provides three-phase excitation for three-phase test samples; the three-phase source being very highly symmetrical; provides measurements of voltages, phase angles, currents, active powers and reactive powers for each phase of the three-phase excitation; measures the test sample with excitation applied to the HV winding or to the LV windings; measurements are conducted truly differentially, thus allowing interconnections between the test windings or grounds on the windings; the instrument is capable of applying corrections to the measured voltage ratio so that the results become very close to the true turns ratio of the transformer; as one error in ratio determination is due to excitation losses, it measures the transformer characteristics at two or more excitation voltages and determines the correction to the voltage ratio to become true turns ratio; another method of determining the true turns ratio is to average two measurements, one measured with the HV winding excited and the other measured with the LV winding excited at the same flux level the instrument calculates the symmetrical components in the excitation signal applied to one winding as well as that of the other winding of the transformer; comparing the applied positive sequence voltage to one winding with the positive sequence voltage on the other winding the instrument determines the true three-phase ratio, as well as any phase displacement; the instrument can determine problems within the test transformer by comparing the applied negative sequence to one winding with the negative sequence measured on the other winding of the transformer.

Regarding the aforementioned features, three-phase excitation of a three-phase transformer allows computation of the positive and negative sequence of the excitation signal as well as that of the other winding. The ratio of the positive sequence components provides a true three-phase turns ratio, and the difference in phase value provides the true three-phase phase shift of the transformer. In a well-balanced three-phase system, the positive sequence is very close to the average of the three line-to-line voltages. The negative sequence is approximately the average of the differences between three line-to-line voltages. The above expression is only 'approximate' as differences in phase angles as well magnitude need to be accounted for. The true three phase turns ratio is very close to the average of the three per-phase turns ratios. The true three-phase phase shift is approximately the average of the three per-phase phase shifts. An ideal three-phase transformer will provide no distortion, no distortion with respect to frequency (that is—not generate any harmonics) as well as no distortion with respect to "sequence", that is—not generating any negative sequence components. Generation of negative sequence components is a sign of differences between the individual phases which includes such things as different turn ratios or different core characteristics (core loss). Different turn ratios or different core losses indicate shorted turns or similar problems in the transformer.

In embodiments described herein, test excitation features may include any combination of the following features: instrument shall provide low voltage based three phase excitation (1 to 48V switched DC); instrument shall provide low voltage based single phase excitation (1 to 48V switched DC); instrument shall provide ability to inject low voltage excitation test voltage into the primary windings of the transformer; instrument shall provide ability to inject low voltage excitation test voltage into the secondary windings of the transformer; the secondary winding voltage injection provides a unique method to generate high voltage primary winding injection; instrument shall provide automatic and/or manual switching of transformer primary versus secondary low voltage injection (as determined by customer preference and/or transformer design/construction); internal instrument test voltage selection (between primary and secondary side of transformer) removes the need to externally switch test Lead connections at the transformer—safer and more efficient (saving overall test completion time); the instrument shall have the capability to generate variable frequency low voltage injection, providing a means to measure multiple voltage ratios, excitation currents, and phase variations to produce a transformer core loss characterization curve which can be used to apply ratio correction algorithms; variable frequency, low voltage injection applied to simulate lower test voltage as a means to excite within the linear portion of the transformer under test—this is specifically relevant to testing current transformers (CTs); the instrument shall have the capability to generate variable low voltage injections, providing a means to measure multiple voltage ratios, excitation currents, and phase variations to produce a transformer core loss characterization curve which can be used to apply ratio correction algorithms In embodiments described herein, test measurement features may include any combination of the following features: instrument shall have the capability to measure voltage ratios of all three phases simultaneously for three phase transformers; instrument shall have the capability to measure phase shift and phase deviation (primary versus secondary) of all three phases simultaneously for three phase transformers; instrument shall have the capability to measure excitation current on three phases simultaneously for three phase transformers; instrument shall have the capability to measure voltage ratios on a single phase transformer (phase to phase and/or phase to neutral) as well as any individual phases for three phase transformers (phase to phase and phase to neutral); instrument shall have the capability to measure excitation current for single phase transformers; instrument shall provide a smart excitation measurement method preventing excitation and/or measurement circuit damage due to incorrect test lead connections; instrument shall provide a smart excitation measurement method preventing instrument damage and limiting user danger due to transformer step-up overvoltage conditions created by high winding ratio transformers which exceed a set design limit; instrument shall provide a smart excitation measurement method to manage automatic and manual switching of primary/secondary excitation based on determination of the winding turns ratio of the transformer under test; instrument shall provide an automatic measurement control methodology for the execution of multiple excitation voltage measurements providing a characterization of the core of the transformer under test; the instrument shall apply turns ratio correction algorithms to improve the reported turns ratio using the determined transformer core characterization obtained in steps above; instrument shall improve overall test time efficiency on multi-tap transformers by applying initial determined transformer core characteristics and resulting correction algorithm to recurring turns ratio tests.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:
1. A transformer turns ratio meter comprising:
a switching matrix;
a measurement circuit;
an excitation circuit; and a processor in communication with the switching matrix, measurement circuit, and excitation circuit, the processor configured to:
  configure the switching matrix in a first configuration;
  apply a first excitation signal to a first side of a transformer;
  measure a first voltage generated in response to the first excitation signal at a second side of the transformer;
  determine a first turns ratio estimate based upon the first voltage and first excitation signal;
  configure the switching matrix in a second configuration;
  apply a second excitation signal to the second side of the transformer;
  measure a second voltage generated in response to the second excitation signal at the first side of the transformer;
  determine a second turns ratio estimate based upon the second voltage and second excitation signal; and
  determine a turns ratio of the transformer based upon the first turns ratio estimate and the second turns ratio estimate.

2. The transformer turns ratio meter of claim 1, wherein the first excitation signal comprises a single-phase signal.

3. The transformer turns ratio meter of claim 1, wherein the first excitation signal comprises a three-phase signal.

4. The transformer turns ratio meter of claim 1, wherein the processor is further configured to determine the second excitation signal based upon the first turns ratio estimate.

5. The transformer turns ratio meter of claim 1, wherein the processor configured to determine the turns ratio of the transformer comprises the processor configured to determine an average of the first turns ratio estimate and the second turns ratio estimate.

6. The transformer turns ratio meter of claim 1, wherein the processor is further configured to:
  apply a third excitation signal to the first side of the transformer;
  measure a third voltage generated in response to the third excitation signal at the second side of the transformer; and
  determine an excitation loss of the transformer based upon the first voltage and the third voltage.

7. The transformer turns ratio meter of claim 6, wherein the turns ratio of the transformer is further based upon the excitation loss.

8. The transformer turns ratio meter of claim 1, wherein the first excitation signal comprises a first square-wave excitation and the second excitation signal comprises a second square-wave excitation.

9. The transformer turns ratio meter of claim 1, wherein the first voltage comprises a step down voltage and the second voltage comprises a step up voltage.

10. A method for transformer turns ratio measurement, the method comprising:
  configuring a switching matrix in a first configuration;
  applying a first excitation signal to a first side of a transformer;
  measuring a first voltage generated in response to the first excitation signal at a second side of the transformer;
  determining a first turns ratio estimate based upon the first voltage and first excitation signal;
  configuring the switching matrix in a second configuration;
  applying a second excitation signal to the second side of the transformer;
  measuring a second voltage generated in response to the second excitation signal at the first side of the transformer;
  determining a second turns ratio estimate based upon the second voltage and second excitation signal; and
  determining a turns ratio of the transformer based upon the first turns ratio estimate and the second turns ratio estimate.

11. The method of claim 10, wherein the first excitation signal comprises a single-phase signal.

12. The method of claim 10, wherein the first excitation signal comprises a three-phase signal.

13. The method of claim 10 further comprising determining the second excitation signal based upon the first turns ratio estimate.

14. The method of claim 10, wherein determining the turns ratio of the transformer comprises determining an average of the first turns ratio estimate and the second turns ratio estimate.

15. The method of claim 10 further comprising:
  applying a third excitation signal to the first side of the transformer;
  measuring a third voltage generated in response to the third excitation signal at the second side of the transformer; and
  determining an excitation loss of the transformer based upon the first voltage and the third voltage.

16. The method of claim 15, wherein the turns ratio of the transformer is further based upon the excitation loss.

17. The method of claim 10, wherein the first excitation signal comprises a first square-wave excitation and the second excitation signal comprises a second square-wave excitation.

18. The method of claim 10, wherein the first voltage comprises a step down voltage and the second voltage comprises a step up voltage.

* * * * *